United States Patent
Kamijyo et al.

(10) Patent No.: US 11,695,392 B2
(45) Date of Patent: Jul. 4, 2023

(54) HIGH FREQUENCY INTEGRATED CIRCUIT FOR WIRELESS COMMUNICATION

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Yuki Kamijyo, Kawasaki Kanagawa (JP); Hironori Nagasawa, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/459,822

(22) Filed: Aug. 27, 2021

(65) Prior Publication Data

US 2022/0255535 A1 Aug. 11, 2022

(30) Foreign Application Priority Data

Feb. 8, 2021 (JP) .................... 2021-018591

(51) Int. Cl.
*H03H 11/24* (2006.01)
*H01P 5/12* (2006.01)

(52) U.S. Cl.
CPC ............. *H03H 11/245* (2013.01); *H01P 5/12* (2013.01)

(58) Field of Classification Search
None
See application file for complete search history.

(56) References Cited

U.S. PATENT DOCUMENTS

2008/0297661 A1 12/2008 Kitaguchi
2019/0068167 A1* 2/2019 Bacon .................... H03H 7/38

FOREIGN PATENT DOCUMENTS

| JP | 2002-076949 A | 3/2002 | |
| JP | 2008-271441 A | 11/2008 | |
| JP | 2015-171081 A | 9/2015 | |
| WO | WO-03056738 A1 * | 7/2003 | ......... H04J 14/0204 |

* cited by examiner

*Primary Examiner* — Daniel C Puentes
(74) *Attorney, Agent, or Firm* — Allen & Overy LLP

(57) ABSTRACT

According to an embodiment, a high frequency integrated circuit includes a signal splitter, an attenuator, a first conductive element, and first to eighth switches. The signal splitter receives a high frequency signal at an input terminal, splits the high frequency signal to two lines, and outputs the signals split into the two lines from a first output terminal and a second output terminal. The attenuator has multiple amounts of attenuation values. In the first conductive element, a first amount of attenuation is set. The high frequency integrated circuit outputs a plurality of output signals having different gain values from the first high frequency output terminal and the second high frequency output terminal, respectively.

19 Claims, 14 Drawing Sheets

| ATTENUATOR | SW10 | SW11/SW12 | SW13 | SW14/SW15 | SW16 | |
|---|---|---|---|---|---|---|
| LOSS MODE 1 | "ON" | "OFF" | "ON" | "OFF" | "ON" | LOSS AS SAME AS THAT OF "CONDUCTIVE ELEMENT 3" |
| LOSS MODE 2 | "OFF" | "ON" | "OFF" | "OFF" | "ON" | ATTENUATOR 10 "ACTIVE" |
| LOSS MODE 3 | "OFF" | "OFF" | "ON" | "ON" | "OFF" | ATTENUATOR 11 "ACTIVE" |

Fig. 5

|  | ATTENUATION (AMOUNT OF LOSSES) |
|---|---|
| SIGNAL SPLITTER 2 | 3dB (@N1, N2) |
| CONDUCTIVE ELEMENT 3 | 1dB |
| ATTENUATOR 4 | 1dB (SELECT CONDUCTIVE ELEMENT 12) or<br>3dB (SELECT ATTENUATOR 10) or<br>5dB (SELECT ATTENUATOR 11) |

| GAIN (VARIABLE GAIN AMPLIFIER 5) | Pout1 (GAIN) | Pout2 (GAIN) |
|---|---|---|
| 20dB | 16dB | 16dB |
|  | 16dB | 13dB |
|  | 16dB | 11dB |
|  | 13dB | 16dB |
|  | 11dB | 16dB |
| 15dB | 11dB | 11dB |
|  | 11dB | 8dB |
|  | 11dB | 6dB |
|  | 8dB | 11dB |
|  | 6dB | 11dB |

Fig. 12

HIGH FREQUENCY INTEGRATED CIRCUIT FOR WIRELESS COMMUNICATION

CROSS REFERENCE TO RELATED APPLICATION

This application is based upon and claims the benefit of priority from the prior Japanese Patent Application No. 2021-018591, filed on Feb. 8, 2021, the entire contents of which are incorporated herein by reference.

FIELD

Embodiments described herein are related to a high frequency integrated circuit.

BACKGROUND

Communication technologies in wireless communication and the like have been undergoing evolution for higher frequency and higher functionality. In particular, in the wireless communication, communication standards have been reviewed in each generation (such as 3G, 4G, 5G, and so on), and adaptation to higher frequency in used bands and modularization have been progressing rapidly.

High frequency integrated circuits used for the wireless communication device have been required to meet various specifications of characteristics for each generation of the communication standards or to deal with two or more such generations. For example, such a high frequency integrated circuit is required to output multiple signals having different gains output from a high frequency output terminal of a receiving block or a transmitting block.

The requirement will not be satisfied by simply adopting a variable gain amplifier, a signal splitter, and the like. In addition, it is also required not to deteriorate insertion loss, isolation, and the like.

BRIEF DESCRIPTION OF THE DRAWINGS

FIG. 5 is a diagram listing loss modes of the attenuator according to the first embodiment;

FIG. 12 is a diagram to explain gain settings of the high frequency integrated circuit according to the second embodiment;

DETAILED DESCRIPTION

Figure 1:
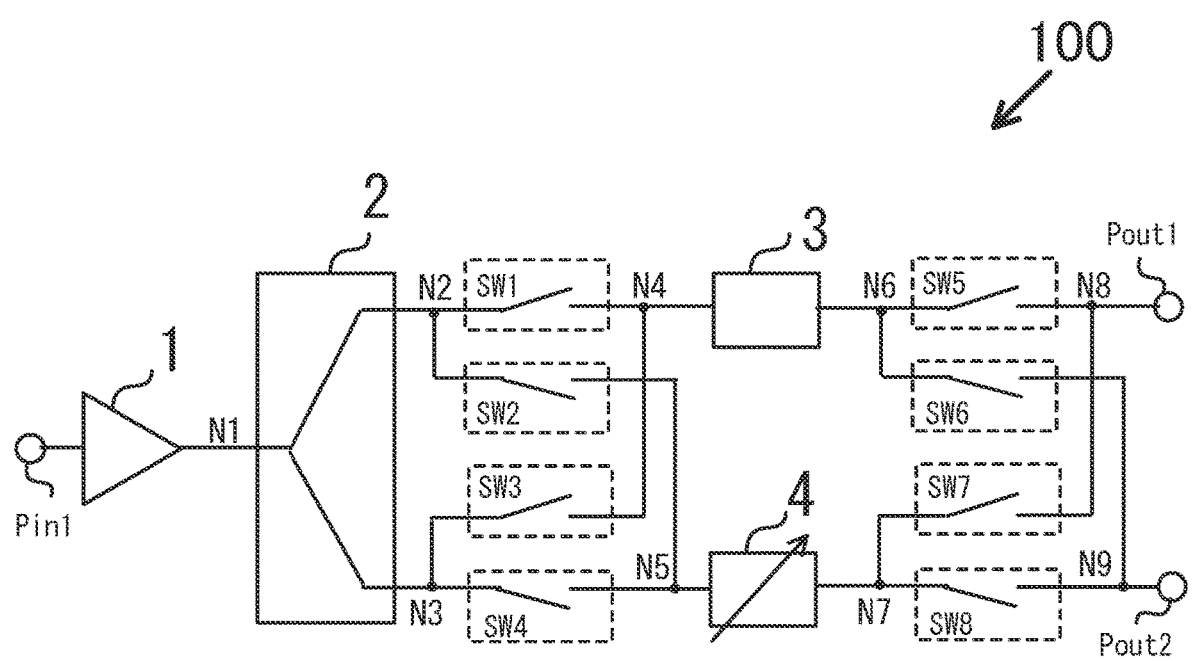
FIG. 1 is a circuit diagram illustrating a high frequency integrated circuit according to a first embodiment.

According to an embodiment, a high frequency integrated circuit includes a signal splitter, an attenuator, a first conductive element, and first to eighth switches. The signal splitter receives a high frequency signal at an input terminal, splits the high frequency signal into two lines, and outputs the signals split into the two lines from a first output terminal and a second output terminal. The attenuator has multiple amount of attenuation. The first conductive element has a first amount of attenuation. The first switch is placed between a first output terminal of the signal splitter and the first conductive element, and selects conductive or non-conductive between the first output terminal of the signal splitter and the first conductive element. The second switch is placed between the first output terminal of the signal splitter and the attenuator, and, selects conductive or non-conductive between the first output terminal of the signal splitter and the attenuator. The third switch is placed between a second output terminal of the signal splitter and the first conductive element, and selects conductive or non-conductive between the second output terminal of the signal splitter and the first conductive element. The fourth switch is placed between the second output terminal of the signal splitter and the attenuator, and selects conductive or non-conductive between the second output terminal of the signal splitter and the attenuator. The fifth switch is placed between the first conductive element and a first high frequency output terminal, and selects conductive or non-conductive between the first conductive element and the first high frequency output terminal. The sixth switch is placed between the first conductive element and a second high frequency output terminal, and selects conductive or non-conductive between the first conductive element and the second high frequency output terminal. The seventh switch is placed between the attenuator and the first high frequency output terminal, and selects conductive or non-conductive between the attenuator and the first high frequency output terminal. The eighth switch is placed between the attenuator and the second high frequency output terminal, and selects conductive or non-conductive between the attenuator and the second high frequency output terminal. The high frequency integrated circuit outputs a plurality of output signals having different power levels from the first high frequency output terminal and the second high frequency output terminal, respectively.

More embodiments will be described below with reference to the drawings. In the drawings, the same reference numerals represent the same or similar portions.

A high frequency integrated circuit according to a first embodiment will be described with reference to the drawings. FIG. 1 is a circuit diagram illustrating the high frequency integrated circuit.

In the first embodiment, first to fourth switches are arranged between a signal splitter that splits a high frequency signal into two signal lines and a se of an attenuator and a conductive element, while fifth to eighth switches are arranged between the set of the attenuator and the conductive element and a set of a first high frequency output terminal and a second high frequency output terminal. The plurality of signals having different power levels are output from the first high frequency output terminal and the second high frequency output terminal, respectively.

As illustrated in FIG. 1, a high frequency integrated circuit 100 includes a gain amplifier 1, a signal splitter 2, a conductive element 3, an attenuator 4, switches SW1 to SW8, a high frequency input terminal Pin1, a high frequency output terminal Pout1, and a high frequency output terminal Pout2, The high frequency integrated circuit 100 is applied to a receiving block, a transmitting block, and the like in the wireless communication device according to any of the 3G, 4G, and 5G communication standards, for example.

The gain amplifier 1 is placed between the high frequency input terminal Pin1 and a node N1. The gain amplifier 1 amplifies a high frequency signal input through the high frequency input terminal Pin1 and outputs the amplified signal from the node N1. The gain amplifier 1 corresponds to a low noise amplifier (LNA) when the high frequency integrated circuit 100 is the receiving block in the wireless communication device, or corresponds to a power amplifier (PA) when the high frequency integrated circuit 100 is the transmitting block in the wireless communication device.

The signal splitter 2 is placed between the node N1 and a set of a node N2 and a node N3. The signal splitter 2 receives the high frequency signal output from the gain amplifier 1 at an input terminal (the node N1), distributes the high frequency signal to two lines, and then outputs the two signals said above. The signal splitter 2 is also called a power divider, a power splitter, a divider, or the like.

The switches SW1 to SW4 are arranged between the signal splitter 2 and a set of the conductive element 3 and the attenuator 4.

The switch SW1 is placed between the node N2 and a node N4 as an input terminal of the conductive element, and controls on and off states between the node N2 and the node N4 based on a control signal.

The switch SW2 is placed between the node N2 and a node N5 (the attenuator 4), and controls on and off states between the node N2 and the node N5 (the attenuator 4) based on the control signal.

The switch SW3 is placed between the node N3 and the node N4 as an input terminal of the conductive element, and controls on and off states between the node N3 and the node N4 (the conductive element 3) based on the control signal.

The switch SW4 is placed between the node N3 and the node N5 (the attenuator 4), and controls on and off states between the node N3 and the node N5 (the attenuator 4) based on the control signal.

The conductive element 3 is placed between the node N4 and a node N6. The conductive element has a predetermined amount of attenuation (also referred to as an amount of loss). The conductive element 3 received a signal at the node N4 and outputs an attenuated signal from the node N6.

The attenuator 4 is placed between the node N5 and a node N7. A plurality of amounts of attenuation having different values are set in the signal passband in the attenuator 4. The attenuator 4 received a signal at the node N5 and outputs an attenuated signal from the node N7.

The switches SW5 to SW8 are arranged between a set of the conductive element 3 and the attenuator 4 and a set of the high frequency output terminal Pout1 and the high frequency output terminal Pout2.

The switch SW5 is placed between the node N6 and a node N8 (the high frequency output terminal Pout1), and controls on and off states between the node N6 and the node N8 (the high frequency output terminal Pout1) based on the control signal.

The switch SW6 is placed between the node N6 and a node N9 (the high frequency output terminal Pout2), and controls on and off states between the node N7 and the node N9 (the high frequency output terminal Pout2) based on the control signal.

The switch SW7 is placed between the node N7 and the node N8 (the high frequency output terminal Pout1), and controls on and off states between the node N7 and the node N8 (the high frequency output terminal Pout1) based on the control signal.

The switch SW8 is placed between the node N7 and the node N9 (the high frequency output terminal Pout2), and controls on and off states between the node N7 and the node N9 (the high frequency output terminal Pout2) based on the control signal.

The high frequency output terminal Pout1 outputs multiple power levels by variable attenuated value of the attenuator 4 and the predetermined gains of the gain amplifier 1. The high frequency output terminal Pout2 outputs multiple power levels by variable attenuated value of the attenuator 4 and the predetermined gains of the gain amplifier 1 (to be described later in detail).

In the embodiment, the multiple power levels by variable attenuated value of the attenuator 4 and the predetermined gains of the gain amplifier 1 output from the high frequency output terminal Pout1 and the high frequency output terminal Pout2, respectively, are set equal to one another. However, the invention is not limited only to the above-described configuration. The multiple power levels output from the high frequency output terminal Pout1 and the high frequency output terminal Pout2, respectively, may be different from one another.

Figure 2:
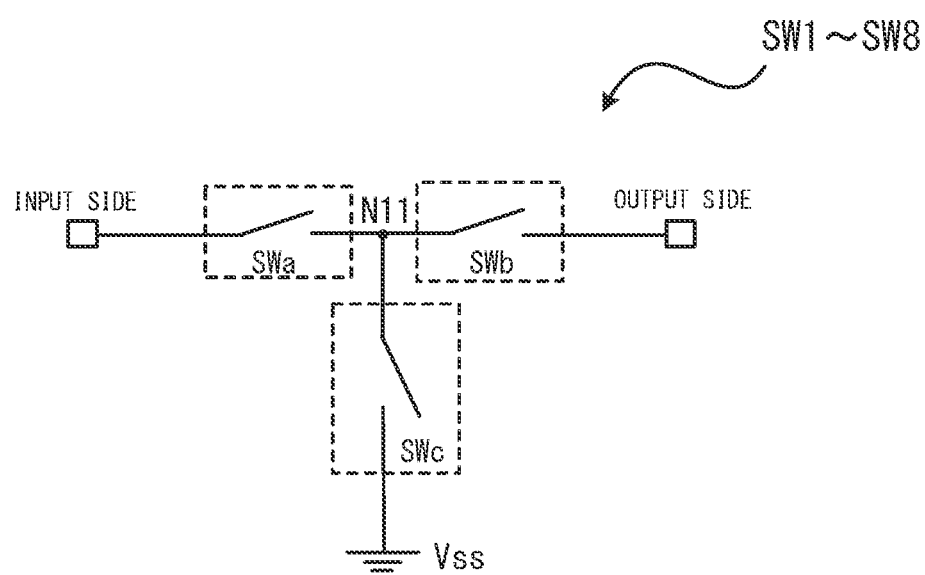
FIG. 2 is a circuit diagram illustrating a switch according to the first embodiment.
Figure 3:
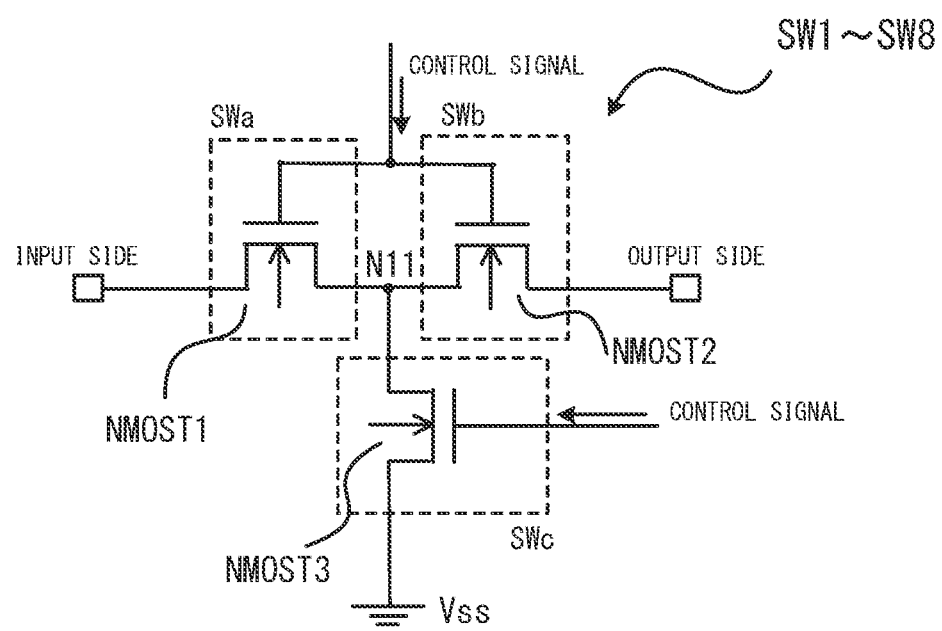
FIG. 3 is a diagram to explain transistors constituting the switch illustrated in FIG. 2.

A specific configuration of the switches SW1 to SW8 will be described with reference to FIG. 2 and FIG. 3. FIG. 2 is a circuit diagram illustrating each of the switches. FIG. 3 is a diagram to explain transistors constituting the switches illustrated in FIG. 2.

As illustrated in FIG. 2, each of the switches SW1 to SW8 is a T-type switch that is formed from switches SWa to SWc. Each of the switches SW1 to SW8 is a high frequency switch having a very small insertion loss property in the passband (such as a gigahertz band) when the switch is on and a very large isolation property when the switch is off.

The switch SWa is placed between an input side and a node N11, and selects conductive or non-conductive between the input side and the node N11 based on a control signal. The switch SWb is placed between the node N11 and an output side, and controls on and off states between the node N11 and the output side based on a control signal. The switch SWc is placed between the node N11 and ground potential (a common voltage potential) Vss, and controls on and off states between the node N11 and the ground potential (the common voltage potential) Vss. Note that time and a period for the on and off control with the control signal to control the switch may vary among the switches SW1 to SW8.

As illustrated in FIG. 3, each of the switches SW1 to SW8 includes N-channel MOS transistors NMOST1 to NMOST3 formed on a silicon-on-insulator (SOI) substrate.

The N-channel MOS transistor NMOST1 has a first terminal (a drain) coupled to the input side, a second terminal (a source) coupled to the node N11, and a control terminal (a gate) that receives the control signal. The N-channel MOS transistor NMOST2 has a first terminal (a drain) coupled to the node N11, a second terminal (a source) coupled to the output side, and a control terminal (a gate) that receives the control signal input to the control terminal of the N-channel MOS transistor NMOST1. The N-channel MOS transistor NMOST3 has a first terminal (a drain) coupled to the node N11, a second terminal (a source) coupled to the ground potential (the common voltage potential) Vss, and a control terminal (a gate) that receives a control signal.

Here, any of a pseudomorphic high electron mobility transistor (pHEMT), a GaAs MESFET, an N-channel MOS transistor formed on a silicon substrate, and the like may be used instead of the N-channel MOS transistor formed on a SOI substrate.

Figure 4:
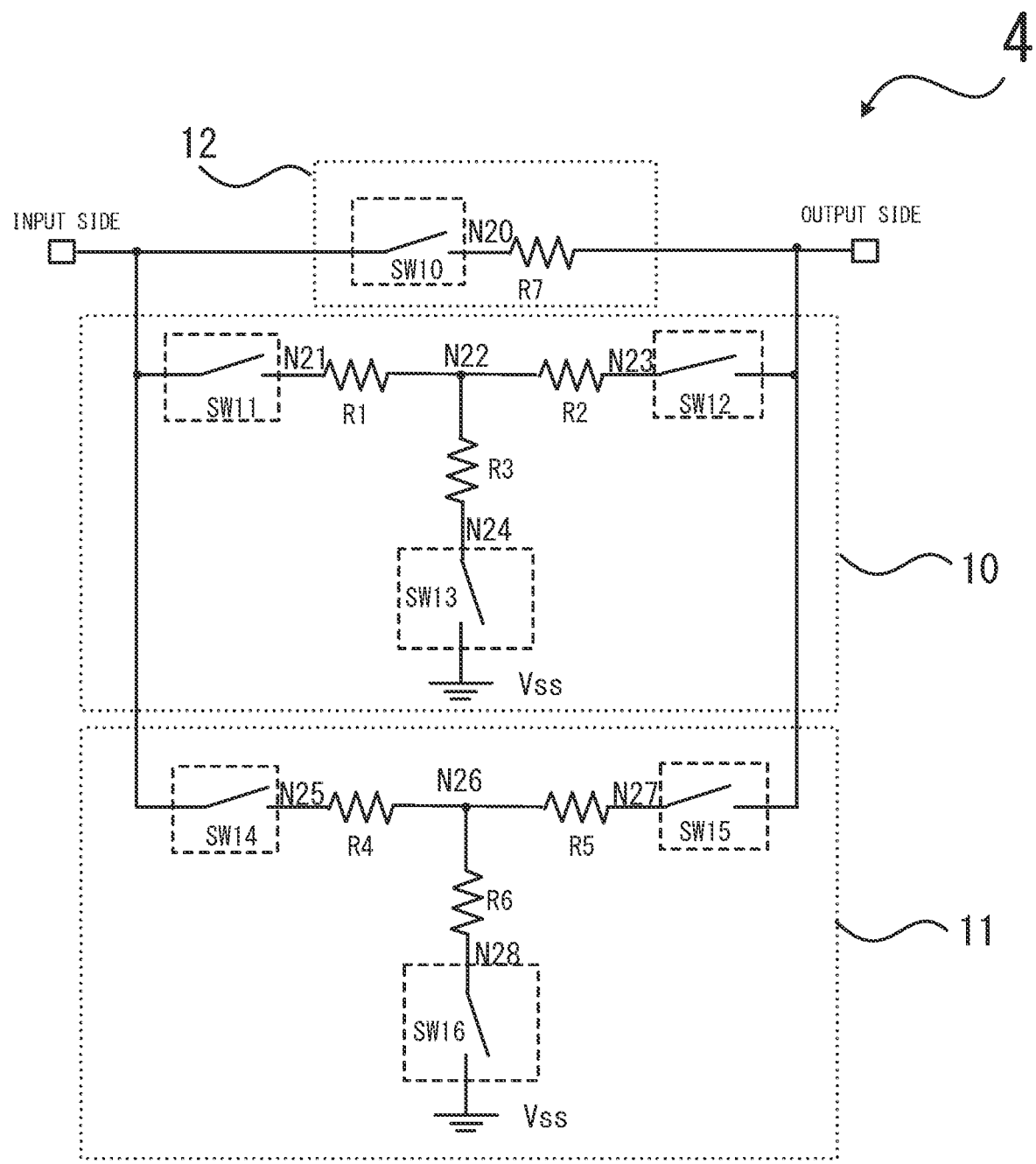
FIG. 4 is a circuit diagram illustrating an attenuator according to the first embodiment.

A specific configuration and loss modes of the attenuator 4 will be described with reference to FIG. 4 and FIG. 5. FIG. 4 is a circuit diagram illustrating the attenuator, and FIG. 5 is a diagram listing loss modes of the attenuator.

As illustrated in FIG. 4, the attenuator 4 is formed of a T-type attenuator 10, a T-type attenuator 11, and a conductive element 12. The T-type attenuator 10, the T-type attenuator 11, and the conductive element 12 are arranged between an input side and an output side. In the attenuator 4, three types of loss modes to attenuate an input signal can be set. Although the attenuator 4 has two sets of the T-type attenuator 10 and the T-type attenuator 11 herein, the invention is not necessarily limited only to the above-described configuration. The attenuator 4 may have one set of the T-type attenuator, for example.

The conductive element 12 is placed between the input side and the output side, and is represented by an equivalent circuit in which a switch SW10 and a resistor R7 are coupled in series. In the conductive element 12, the same amount of loss as the conductive element 3 is set. The switch SW10 is placed between the input side and a node N20, and controls on and off states between the input side and the output side based on a control signal. The resistor R7 is placed between the node N20 and the output side, and attenuates a signal at the node N20 and outputs the attenuated signal to the output side.

The T-type attenuator 10 is placed between the input side and the output side, and is composed of switches SW11 to SW13 and resistors R1 to R3. The attenuation frequency characteristics of the T-type attenuator 10 in a band of interest is small. In the T-type attenuator 10, an amount of loss larger than those by the conductive element 3 and the conductive element 12 is set so that the input signal is attenuated more than those attenuated by the conductive element 3 and the conductive element 12.

The switch SW11 is placed between the input side and a node N21, and selects conductive or non-conductive between the input side and the node N21 based on a control signal. The resistor R1 is placed between the node N21 and a node N22, and attenuates a signal at the node N21. The resistor R2 is placed between the node N22 and a node N23, and attenuates a signal at the node N22. The resistor R1 attenuates the signal at the node N21. The resistor R2 attenuates the signal at the node N21 The switch SW12 is placed between the node N23 and the output side, and controls on and off states between the node N23 and the output side based on a control signal. The resistor R3 is placed between the node N22 and a node N24, and attenuates the signal at the node N22. The switch SW13 is placed between the node N24 and the ground potential (the common voltage potential) Vss, and controls on and off states between the node N24 and the ground potential (the common voltage potential) Vss based on a control signal.

The T-type attenuator 11 is placed between the input side and the output side, and is formed from switches SW14 to S16 and resistors R4 to R6. The T-type attenuator 11 is an attenuator of which the dependency on the frequency in a band that the signal passes through is small. In the T-type attenuator 11, an amount of loss larger than that of the T-type attenuator 10 is set so that the input signal is attenuated more than that attenuated by the T-type attenuator 10. However, the invention is not necessarily limited to the above-described configuration.

The switch SW14 is placed between the input side and a node N25, and selects conductive or non-conductive between the input side and the node N25 based on a control signal. The resistor R4 is placed between the node N25 and a node N26, and attenuates a signal at the node N25. The resistor R5 is placed between the node N26 and a node N27, and attenuates a signal at the node N26. The switch SW15 is placed between the node N27 and the output side, and controls on and off states between the node N27 and the output side based on a control signal. The resistor R6 is placed between the node N26 and a node N28, and attenuates the signal at the node N26. The switch SW16 is placed between the node N28 and the ground potential (the common voltage potential) Vss, and controls on and off states between the node N28 and the ground potential (the common voltage potential) Vss based on a control signal.

As illustrated in FIG. 5, three loss modes can be set in the attenuator 4. In a loss mode 1, the conductive element 12 is set to an "active" state, each of the T-type attenuator 10 and the T-type attenuator 11 is set to an "inactive" state. Specifically, the switch SW10 is set "on", the switches SW11, SW12 are set "off", the switch SW 13 is set "on", the switches SW14, SW15 are set "off", and the switch SW 16 is set "on". An amount of loss in the loss mode 1 is set equal to an amount of loss of the conductive element 3.

In a loss mode 2, the T-type attenuator 10 is set to the "active" state, each of the conductive element 12 and the T-type attenuator 11 is set to the "inactive" state. Specifically, the switch SW10 is set "off", the switches SW11, SW12 are set "on", the switch SW 13 is set "off", the switches SW14, SW15 are set "off", and the switch SW 16 is set "on".

In a loss mode 3, the T-type attenuator 11 is set to the "active" state, each of the conductive element 12 and the T-type attenuator 10 is set to the "inactive" state. Specifically, the switch SW10 is set "off", the switches SW11, SW12 are set "off", the switch SW 13 is set "on", the switches SW14, SW15 are set "on", and the switch SW 16 is set "off".

Figure 6:
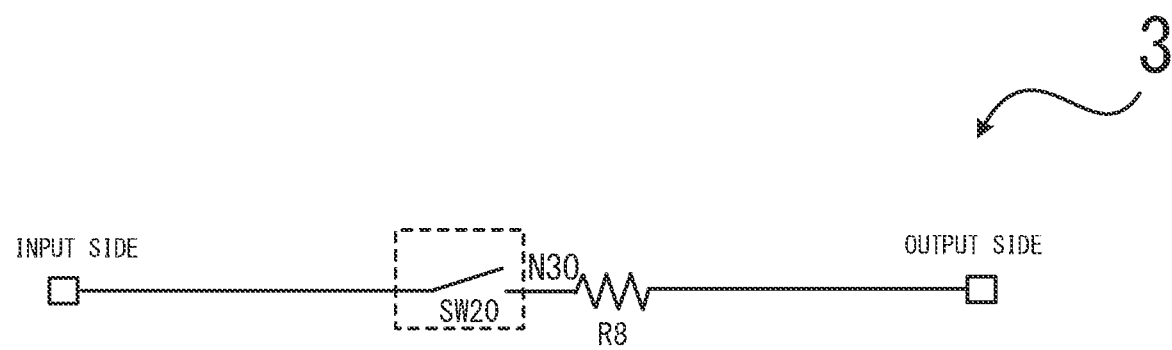
FIG. 6 is a circuit diagram illustrating a conductive element according to the first embodiment.

As illustrated in FIG. 6, the conductive element 3 is placed between an input side and an output side, and is represented by an equivalent circuit in which a switch SW20 and a resistor R8 are connected in series. The switch SW20 is placed between the input side and a node N30, and controls on and off states between the input side and the output side based on a control signal. The resistor R8 is placed between the node N30 and the output side, and attenuates a signal and outputs the attenuated signal to the output side.

Figure 7:
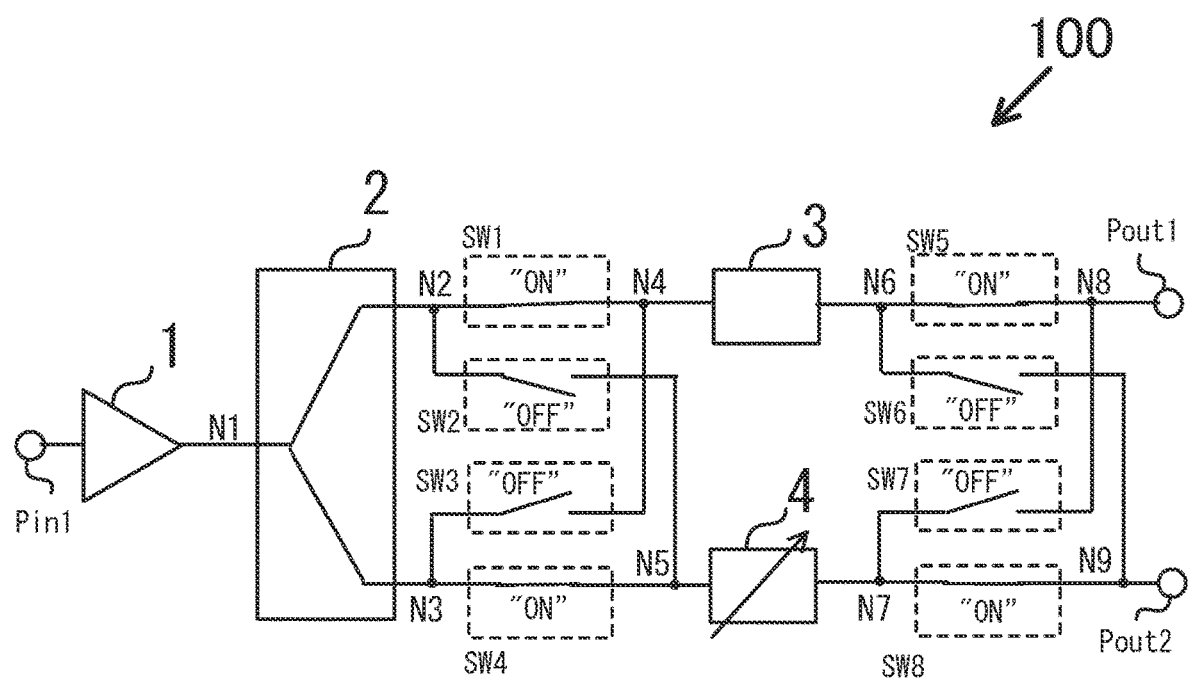
FIG. 7 is a diagram to explain a gain setting of the high frequency integrated circuit according to the first embodiment.
Figure 8:
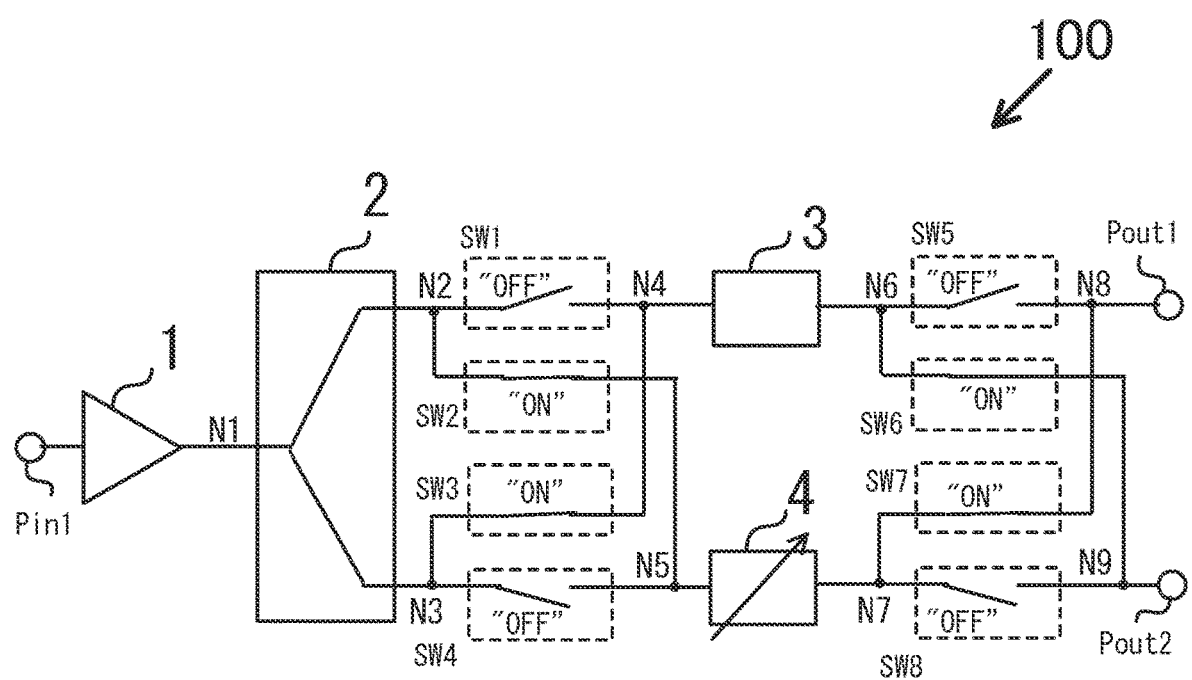
FIG. 8 is a diagram to explain another gain setting of the high frequency integrated circuit according to the first embodiment.

Next, vain settings of the high frequency integrated circuit 100 will be described with reference to FIG. 7 and FIG. 8. FIG. 7 and FIG. 8 are diagrams each explaining a gain setting of the high frequency integrated circuit.

Assuming that the amount of loss of each of the conductive element 3 and the conductive element 12 is loss amount 1, that the amount of loss of the T-type attenuator 10 is loss amount 2, and that the amount of loss of the T-type attenuator 11 is loss amount 3, the amounts of loss are set to satisfy:

loss amount 1<loss amount 2<loss amount 3    Formula (1).

A gain of the signal output from the gain amplifier 1 is defined as Gamp(a gain amp). An amount of loss of the signal split into the two lines and output from the signal splitter 2 is assumed to be 3 dB, The insertion losses of the switches SW1 to SW8 are extremely small on state, and can therefore be deemed as negligible level. Meanwhile, the switches SW1 to SW8 have the large isolation properties when the switches are off, hence the influence of the switches that are off to the other switches is negligible.

As illustrated in FIG. 7, when the switches SW1, SW4, SW5, SW8 are set "on" and the switches SW2, SW3, SW6, SW7 are set "off", specifically, a first signal route of the node N2→the switch SW1→the node N4→the conductive element 3→the node N6→the switch SW5→the node N8→the high frequency output terminal Pout1 and a second signal route of the node N3→the switch SW4→the node N5→the attenuator 4→the node N7→the switch SW8→the high frequency output terminal Pout2 are made.

One type of the gain of the signal output from the high frequency output terminal Pout1 in the first signal route is set up. The gain of the signal output from the high frequency output terminal Pout1 can be expressed as the Gamp(a, gain amp) minus the amount of loss of the signal splitter 2 (3 dB) minus the loss amount 1.

Three types of the gain of the signal output from the high frequency output terminal Pout2 in the second signal route are set up. The first type can be expressed as the gain amp minus the amount of loss of the signal splitter 2 (3 dB) minus the loss amount 1. The second type can be expressed as the gain amp minus the amount of loss of the signal splitter 2 (3 dB) minus the loss amount 2. The third type can be expressed as the gain amp minus the amount of loss of the signal splitter 2 (3 dB) minus the loss amount 3.

As illustrated in FIG. 8, when the switches SW2, SW3, SW6, SW7 are set "on" and the switches SW1, SW4, SW5, SW8 are set "off", specifically, the first signal route of the node N2→the switch SW2→the node N5→the attenuator 4→the node N7→the switch SW7→the node N8→the high frequency output terminal Pout1 and the second signal route of the node N3→the switch SW3→the node N4→the conductive element 3→the node N6→the switch SW→the node N9→the high frequency output terminal Pout2 are made.

One type of the gain of the signal output from the high frequency output terminal Pout2 in the second signal route is set up. The gain of the signal output from the high frequency output terminal Pout2 can be expressed as the gain amp minus the amount of loss of the signal splitter 2 (3 dB) minus the loss amount 1.

Three types of the gain of the signal output from the high frequency output terminal Pout1 in the first signal route are set up. The first type can be expressed as the gain amp minus the amount of loss of the signal splitter 2 (3 dB) minus the loss amount 1. The second type can be expressed as the gain amp minus the amount of loss of the signal splitter 2 (3 dB) minus the loss amount 2. The third type can be expressed as the gain amp minus the amount of loss of the signal splitter 2 (3 dB) minus the loss amount 3.

Here, in a case where the amounts of loss in the passband of the switches SW1 to SW8 are not negligible, all of the amounts of loss of the switches SW1 to SW4 when the switches are on are deemed to be the same loss amount SWILoss1, and all of the amounts of loss of the switches SW5 to SW8 when the switches are on are deemed to be the same loss amount SWLoss2.

The gain expressed as the gain amp minus the amount of loss of the signal splitter 2 (3 dB) minus the loss amount 1 can be expressed by the gain amp minus the amount of loss of the signal splitter 2 (3 dB) minus the loss amount 1 minus (the loss amount SWLoss1 plus the loss amount SWLoss2). The vain expressed as the gain amp minus the amount of loss of the signal splitter 2 (3 dB) minus the loss amount 2 can be expressed by the gain amp minus the amount of loss of the signal splitter 2 (3 dB) minus the loss amount 2 minus (the loss amount SWLoss1 plus the loss amount SWLoss2). The gain expressed as the gain amp minus the amount of loss of the signal splitter 2 (3 dB) minus the loss amount 3 can be expressed by the gain amp minus the amount of loss of the signal splitter 2 (3 dB) minus the loss amount 3 minus (the loss amount SWLoss1 plus the loss amount SWLoss2).

Figure 9:
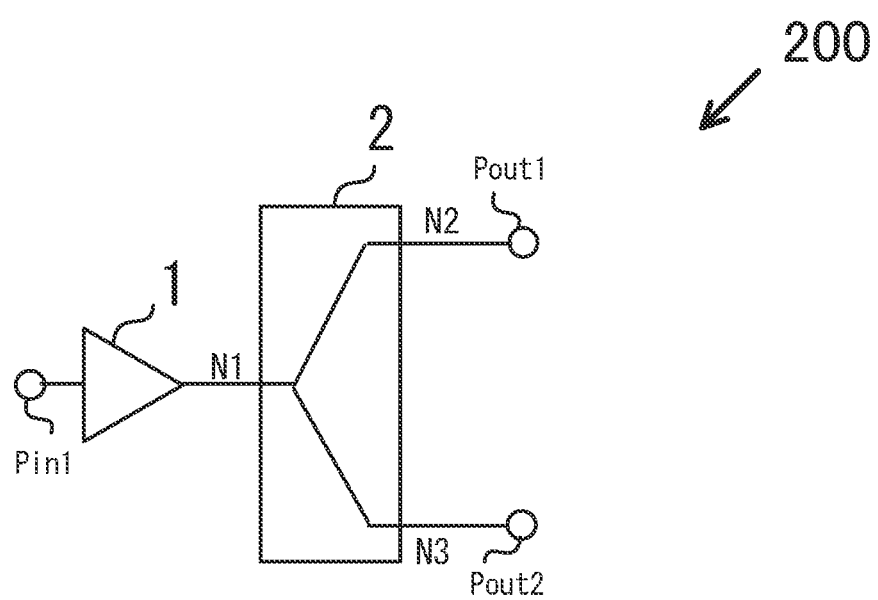
FIG. 9 is a circuit diagram illustrating a high frequency integrated circuit of a first comparative example.
Figure 10:
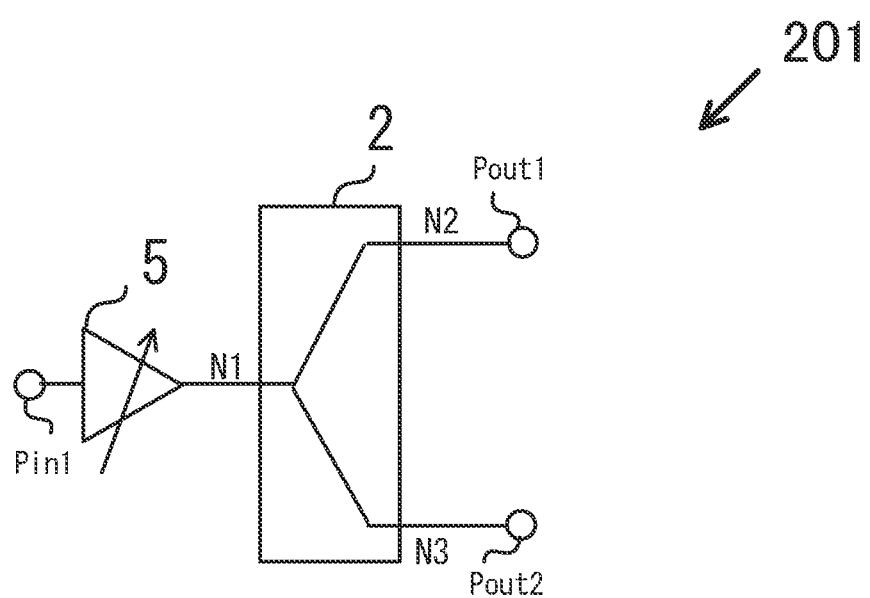
FIG. 10 is a circuit diagram illustrating a high frequency integrated circuit of a second comparative example.

Next, high frequency integrated circuits of comparative examples will be described with reference to FIG. 9 and FIG. 10. FIG. 9 is a circuit diagram illustrating a high frequency integrated circuit of a first comparative example. FIG. 10 is a circuit diagram illustrating a high frequency integrated circuit of a second comparative example.

As illustrated in FIG. 9, a high frequency integrated circuit 200 of the first comparative example includes a gain amplifier 1, a signal splitter 2, a high frequency input terminal Pin1, a high frequency output terminal Pout1, and a high frequency output terminal Pout2. In the high frequency integrated circuit 200 of the first comparative example, a whole gain, which is defined as output power minus input power, in available single state is output from the high frequency output terminal Pout1 and the high frequency output terminal Pout2.

As illustrated in FIG. 10, a high frequency integrated circuit 201 of the second comparative example includes a variable gain amplifier 5, a signal splitter 2, a high frequency input terminal Pin1, a high frequency output terminal Pout1, and a high frequency output terminal Pout2. In the high frequency integrated circuit 201 of the second comparative example, a whole gain, which is defined as output power minus input power, is available multiple stale.

As described above, the high frequency integrated circuit of the embodiment has the gain amplifier 1, the signal splitter 2, the conductive element 3, the attenuator 4, the switches SW1 to SW8, the high frequency input terminal Pin1, the high frequency output terminal Pout1, and the high frequency output terminal Pout2. The switches SW1 to SW4 are arranged between the signal splitter 2 that distributes the high frequency signal to two lines and the set of the attenuator 4 and the conductive element 3, while the switches SW5 to SW8 are arranged between the set of the attenuator 4 and the conductive element 3 and the set of the first high frequency output terminal Pout1 and the second high frequency output terminal Pout2. Each of the switches SW1 to SW8 has only a small insertion loss property in the passband when the switch is on and a very large isolation property when the switch is off. Moreover, using the switches SW1 to SW8, the two signal routes are set between the set of the output terminal (the node N2) and the output terminal (the node N3) of the signal splitter 2 and the set of the high frequency output terminal Pout1 and the high frequency output terminal Pout2.

Accordingly, it is possible to output a plurality of signals having different gain values from the high frequency output terminal Pout1 and the high frequency output terminal Pout2, respectively.

Although three types of loss modes are set in the attenuator 4 in the embodiment, the invention is not limited only to the above-described configuration. Two types or four or more types of loss modes may be set in the attenuator 4. Although the values of the amounts of loss of the conductive element 3 and the conductive element 12 are set equal to each other, the invention is not limited only to the above-described configuration. The amounts of loss may be set different values.

Alternatively, the conductive element 3 may be replaced with an attenuator that is similar to the attenuator 4. In this case, although a circuit scale of the high frequency integrated circuit is increased, it is possible to increase the numbers of combinations of the gain values. In particular, the numbers of combinations of the gain values increases from 5 to 9.

Figure 11:
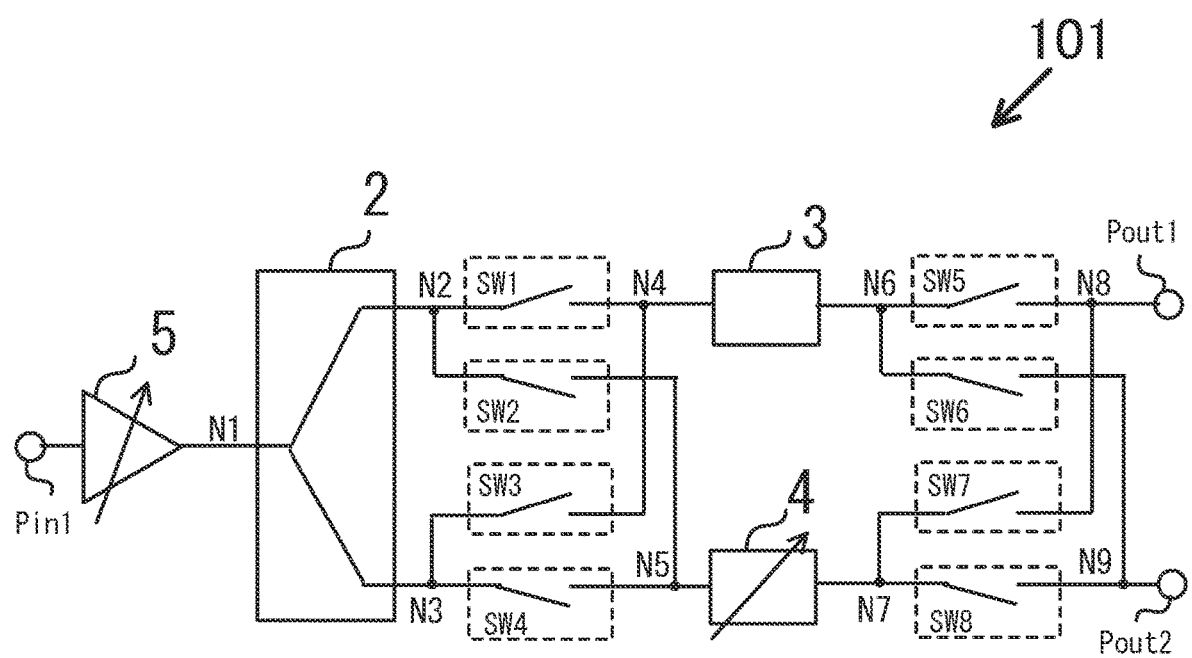
FIG. 11 is a circuit diagram illustrating a high frequency integrated circuit according to a second embodiment.

A high frequency integrated circuit according to a second embodiment will be described with reference to the drawings. FIG. 11 is a circuit diagram illustrating the high frequency integrated circuit.

In the second embodiment, a variable gain amplifier is used in the high frequency integrated circuit. A first high frequency output terminal and a second high frequency output terminal, respectively, output multiple output signals. Each of the multiple output signals has a different gain value.

In the following, the same portions as those in the first embodiment will be designated by the same reference numerals, explanations of those portions will be omitted, and only different portions will be described.

As illustrated in FIG. 11, a high frequency integrated circuit 101 includes a variable gain amplifier 5, the signal splitter 2, the conductive element 3, the attenuator 4, the switches SW1 to SW8, the high frequency input terminal Pin1, the high frequency output terminal Pout1, and the high frequency output terminal Pout2. The high frequency integrated circuit 101 is applied to a receiving block and the like in the wireless communication device according to any of the 3G, 4G, and 5G communication standards, for example.

The variable gain amplifier 5 is placed between the high frequency input terminal Pin1 and the node N1. The variable gain amplifier 5 receives and amplifies a signal input through the high frequency input terminal Pint and outputs the amplified signal from the node N1. Here, in the variable gain amplifier 5, multiple gain values are available to set. The signal splitter 2 receives the various gain signal output from the variable gain amplifier 5 and splits the signal to two lines.

Next, vain settings of the high frequency integrated circuit 101 will be described with reference to FIG. 12. FIG. 12 is a diagram to explain gain settings of the high frequency integrated circuit.

As illustrated in FIG. 12, it is assumed that the amount of attenuation (the amount of loss) of the signal splitter 2 is 3 dB, the amount of attenuation (the amount of loss) of the conductive element 3 is 1 dB, the amount of attenuation (the amount of loss) in the case where the conductive element 12 of the attenuator 4 is selected is 1 dB, the amount of attenuation (the amount of loss) in the case where an attenuator 10 of the attenuator 4 is selected is 3 dB, the amount of attenuation (the amount of loss) in the case where an attenuator 11 of the attenuator 4 is selected is 5 dB, Each amount of loss of the switches SW1 to SW8 is negligible.

In the case where the gain of the signal output from the variable gain amplifier 5 is equal to 20 dB, for example, signals having three types of gains, namely, 16 dB, 13 dB, and 11 dB are output from the high frequency output terminal Pout1 and the high frequency output terminal Pout2. Combinations of the gains are five types, namely, 16 dB/16 dB, 16 dB/13 dB, 16 dB/11 dB, 13 dB/16 dB, and 11 dB/16 dB.

In the case where the gain of the signal output from the variable gain amplifier 5 is equal to 15 dB, for example, signals having three types of gains, namely, 11 dB, 8 dB, and 6 dB are output from the high frequency output terminal Pout1 and the high frequency output terminal Pout2. Combinations of the signals to be output from the high frequency output terminal Pout1 and the high frequency output terminal Pout2 are set to five types, namely, 11 dB/11 dB, 11 dB/8 dB, 11 dB/6 dB, 8 dB/11 dB, and 6 dB/11 dB.

As described above, the high frequency integrated circuit of the embodiment has the variable gain amplifier 5, the signal splitter 2, the conductive element 3, the attenuator 4, the switches SW1 to SW8, the high frequency input terminal Pin1, the high frequency output terminal Pout1 and the high frequency output terminal Pout2. The variable gain amplifier 5 is placed between the high frequency input terminal Pint and the node N1, and outputs the multiple gain values.

As a consequence, it is possible to output more multiple gain values from the high frequency output terminal Pout1 and the high frequency output terminal Pout2 than the first embodiment.

Meanwhile, in the embodiment, the conductive element 3 may be replaced with an attenuator that is similar to the attenuator 4. In this case, although a circuit scale of the high frequency integrated circuit is increased, it is possible to increase multiple gain values from the high frequency output terminal Pout1 and the high frequency output terminal Pout2, and increase the number of the combination of the gain values from 5 to 9.

Figure 13:
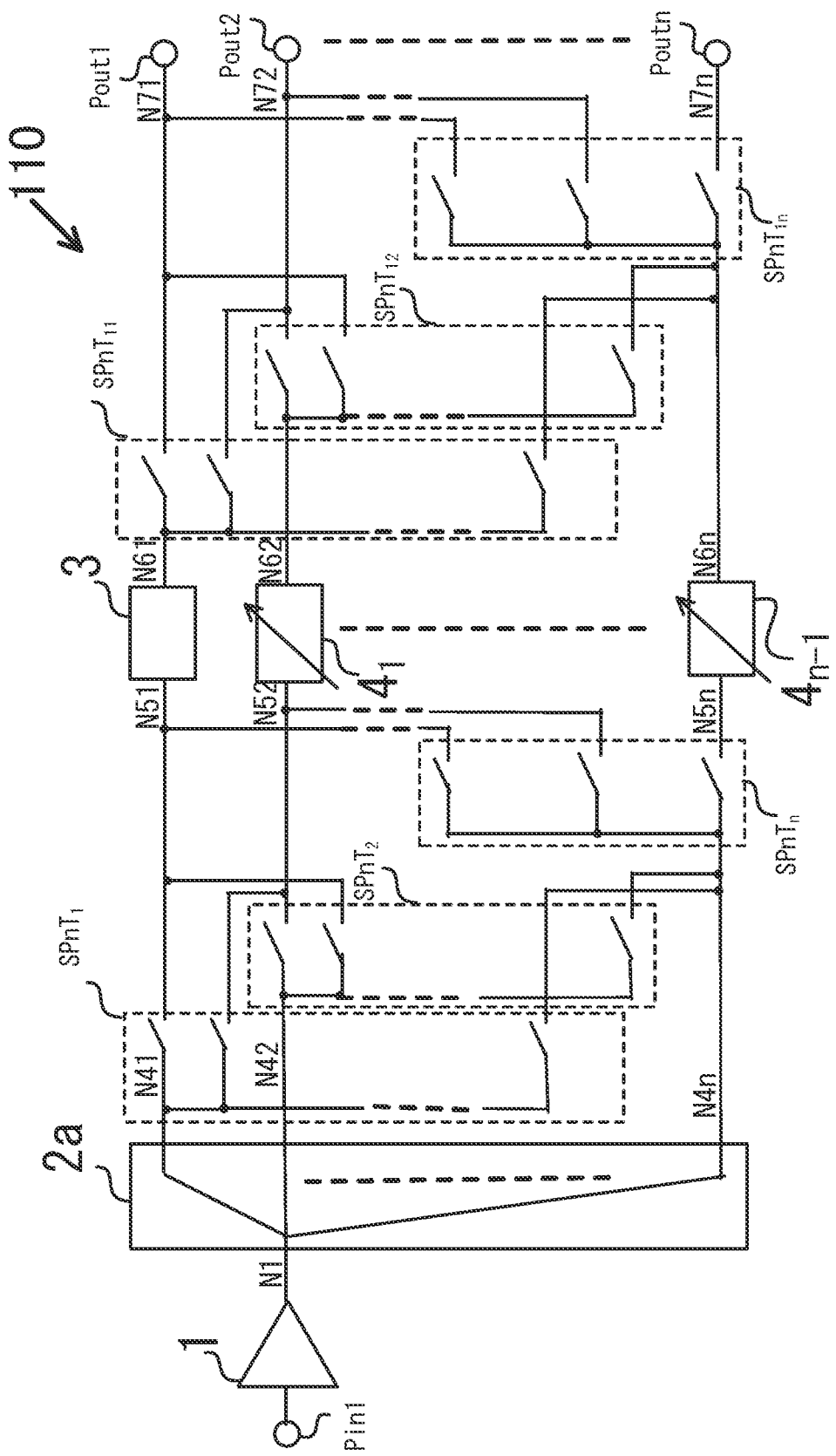
FIG. 13 is a circuit diagram illustrating a high frequency integrated circuit according to a third embodiment.

A high frequency integrated circuit according to a third embodiment will be described with reference to the drawing. FIG. 13 is a circuit diagram illustrating the high frequency integrated circuit.

In the third embodiment, n SPnT switches collectively constituting a first SPnT switch group (n being an integer equal to or above 3) are arranged between a signal splitter, which splits a high frequency signal to n lines, and a set of (n−1) attenuators and a conductive element, and n SPnT switches collectively constituting a second SPnT switch group are arranged between the set of the (n−1) attenuators and the conductive element and first to n-th high frequency output terminals. Multiple gain values are output from the first to n-th high frequency output terminals, respectively.

In the following, the same portions as those in the first embodiment will be designated by the same reference numerals, explanations of those portions will be milled, and only different portions will be described.

As illustrated in FIG. 13, a high frequency integrated circuit 110 includes the gain amplifier 1, a signal splitter 2a, the conductive element 3, attenuators $4_1$ to $4_{n-1}$, SPnT switches $SPnT_1$ to $SPnT_n$, SPnT switches $SPnT_{11}$ to $SPnT_{1n}$, the high frequency input terminal Pin1, and high frequency output terminals Pout1 to Poutn. The high frequency integrated circuit 110 is applied to a receiving block, a transmitting block, and the like in the wireless communication device according to any of the 3G, 4G, and 5G communication standards, for example. Here, n is an integer equal to or above 3.

The signal splitter 2a is placed between the gain amplifier 1 and a set of the SPnT switches $SPnT_1$ to $SPnT_1$ arranged and constituting the first SPnT switch group. The signal splitter 2a splits a signal output from the gain amplifier 1 to n lines (where n is the integer equal to or above 3), and outputs the signals split into the n lines from first to n-th output terminals (nodes N41 to N4n), respectively. Here, the larger the number of split lines are increased, the more the amount of attenuation (the amount of loss) of the signal at the signal splitter 2a is increased.

Each of the SPnT (which stands for "single pole n throw") switches $SPnT_1$ to SPnT and the SPnT switches $SPnT_{11}$ to $SPnT_{1n}$ is a high frequency switch having only a very small insertion loss property in the passband (such as a gigahertz band) when the switch is on and a large isolation property when the switch is off. The insertion loss properties of the SPnT switches $SPnT_1$ to $SPnT_n$ and the SPnT switches $SPnT_{11}$ to $SPnT_{1n}$ are preferably set equal to one another.

The SPnT switches $SPnT_1$ to $SPnT_n$ arranged and constituting the first SPnT switch group are placed between the signal splitter 2a and a set of the conductive element 3 and the (n–1) attenuators $4_1$ to $4_{n-1}$.

The SPnT switch $SPnT_1$ of the first SPnT switch group is placed between the first output terminal (the node N41) of the signal splitter 2a and the set of the conductive element 3 (a node N51) and the (n–1) attenuators $4_1$ to $4_{n-1}$ (nodes N52 to N5n). The SPnT switch $SPnT_1$ selects conductive or non-conductive between the first output terminal (the node N41) of the signal splitter 2a and one of the set of the conductive element 3 (the node N51) and the (n–1) attenuators $4_1$ to $4_{n-1}$ (the nodes N52 to N5n), and turns off between the first output terminal (the node N41) of the signal splitter 2a and the rest of the set of the conductive element 3 (the node N51) and the (n–1) attenuators $4_1$ to $4_{n-1}$ (the nodes N52 to N5n).

The SPnT switch $SPnT_2$ of the first SPnT switch group is placed between the second output terminal (the node N42) of the signal splitter 2a and the set of the conductive element 3 (the node N51) and the (n–1) attenuators $4_1$ to $4_{n-1}$ (the nodes N52 to N5n). The SPnT switch $SPnT_2$ selects conductive or non-conductive between the second output terminal (the node N42) of the signal splitter 2a and one of the set of the conductive element 3 (the node N51) and the (n–1) attenuators $4_1$ to $4_{n-1}$ (the nodes N52 to N5n), and turns off between the second output terminal (the node N42) of the signal splitter 2a and the rest of the set of the conductive element 3 (the node N51) and the (n–1) attenuators $4_1$ to $4_{n-1}$ (the nodes N52 to N5n).

The SPnT switch $SPnT_n$ of the first SPnT switch group is placed between the n-th output terminal (the node N4n) of the signal splitter 2a and the set of the conductive element 3 (the node N51) and the (n–1) attenuators $4_1$ to $4_{n-1}$ (the nodes N52 to N5n). The SPnT switch $SPnT_n$ selects conductive or non-conductive between the n-th output terminal (the node N4n) of the signal splitter 2a and one of the set of the conductive element 3 (the node N51) and the (n–1) attenuators $4_1$ to $4_{n-1}$ (the nodes N52 to N5n), and turns off between the n-th output terminal (the node N4n) of the signal splitter 2a and the rest of the set of the conductive element 3 (the node N51) and the (n–1) attenuators $4_1$ to $4_{n-1}$ (the nodes N52 to N5n).

The conductive element 3 and the (n–1) attenuators $4_1$ to $4_{n-1}$ are placed between the SPnT switches $SPnT_{11}$ to $SPnT_n$ collectively constituting the first switch group and the SPnT switches $SPnT_{11}$ to $SPnT_{1n}$ collectively constituting the second switch group.

The conductive element 3 has the same configuration and properties as that of the conductive element 3 of the first embodiment, and is placed between the node N51 and a node N61. The (n–1) attenuators $4_1$ to $4_{n-1}$ have the same configuration and properties as those of the attenuator 4 of the first embodiment.

The SPnT switches $SPnT_{11}$ to $SPnT_{1n}$ constituting the second SPnT switch group are placed between the set of the conductive element 3 and the (n–1) attenuators $4_1$ to $4_{n-1}$ and a set of the high frequency output terminals Pout1 to Poutn.

The SPnT switch $SPnT_{11}$ of the second SPnT switch group is placed between the conductive element 3 (the node N61) and the set of the high frequency output terminals Pout1 to Poutn (nodes N71 to N7n). The SPnT switch $SPnT_{11}$ selects conductive or non-conductive between the conductive element 3 (the node N61) and one of the high frequency output terminals Pout1 to Poutn (nodes N71 to N7n), and turns off between the conductive element 3 (the node N61) and the rest of the high frequency output terminals Pout1 to Poutn (the nodes N71 to N7n).

The SPnT switch $SPnT_{12}$ of the second SPnT switch group is placed between the attenuator $4_1$ (a node N62) and the set of the high frequency output terminals Pout1 to Poutn (the nodes N71 to N7n). The SPnT switch $SPnT_{12}$ selects conductive or non-conductive between the attenuator $4_1$ (the node N62) and one of the high frequency output terminals Pout1 to Poutn (the nodes N71 to N7n), and turns off between the attenuator $4_1$ (the node N62) and the rest of the high frequency output terminals Pout1 to Poutn (the nodes N71 to N7n).

The SPnT switch $SPnT_{1n}$ selects conductive or non-conductive is placed between the attenuator $4_{n-1}$ (a node N6n) and the set of the high frequency output terminals Pout1 to Poutn (the nodes N71 to N7n). The SPnT switch $SPnT_{1n}$ selects conductive or non-conductive between the attenuator $4_{n-1}$ (the node N6n) and one of the high frequency output terminals Pout1 to Poutn (the nodes N71 to N7n), and turns off between the attenuator $4_{n-1}$ (the node N6n) and the rest of the high frequency output terminals Pout1 to Poutn (the nodes N71 to N7n).

The high frequency output terminals Pout1 to Poutn (the nodes N71 to N7n) output a plurality of signals having different gain values, respectively.

As described above, the high frequency integrated circuit of the embodiment has the gain amplifier 1, the signal splitter 2a, the conductive element 3, the attenuators $4_1$ to $4_{n-1}$, the SPnT switches $SPnT_1$ to $SPnT_n$, the SPnT switches $SPnT_{11}$ to $SPnT_{1n}$, the high frequency input terminal Pin1, and the high frequency output terminals Pout1 to Poutn. The n SPnT switches $SPnT_1$ to $SPnT_n$ collectively constituting the first SPnT switch group are arranged between the signal splitter 2a, which splits the high frequency signal to n lines, and the set of the (n–1) attenuators $4_1$ to $4_{n-1}$ and the conductive element 3, and the n SPnT switches $SPnT_{11}$ to $SPnT_{1n}$ collectively constituting the second SPnT switch group are arranged between the set of the (n–1) attenuators $4_1$ to $4_{n-1}$ and the conductive element 3 and the set of the high frequency output terminals Pout1 to Poutn. The plurality of signals having different gain values are output from the high frequency output terminals Pout1 to Poutn, respectively.

As a consequence, it is possible to output signals having different gain values from a larger number of high frequency output terminals than in the first embodiment.

Meanwhile, in the embodiment, the conductive element 3 may be replaced with an attenuator that is similar to the attenuators $4_1$ to $4_{n-1}$. In this case, although a circuit scale of the high frequency integrated circuit is increased, it is possible to increase multiple gain values output from the high frequency output terminals Pout1 to Poutn.

Figure 14:
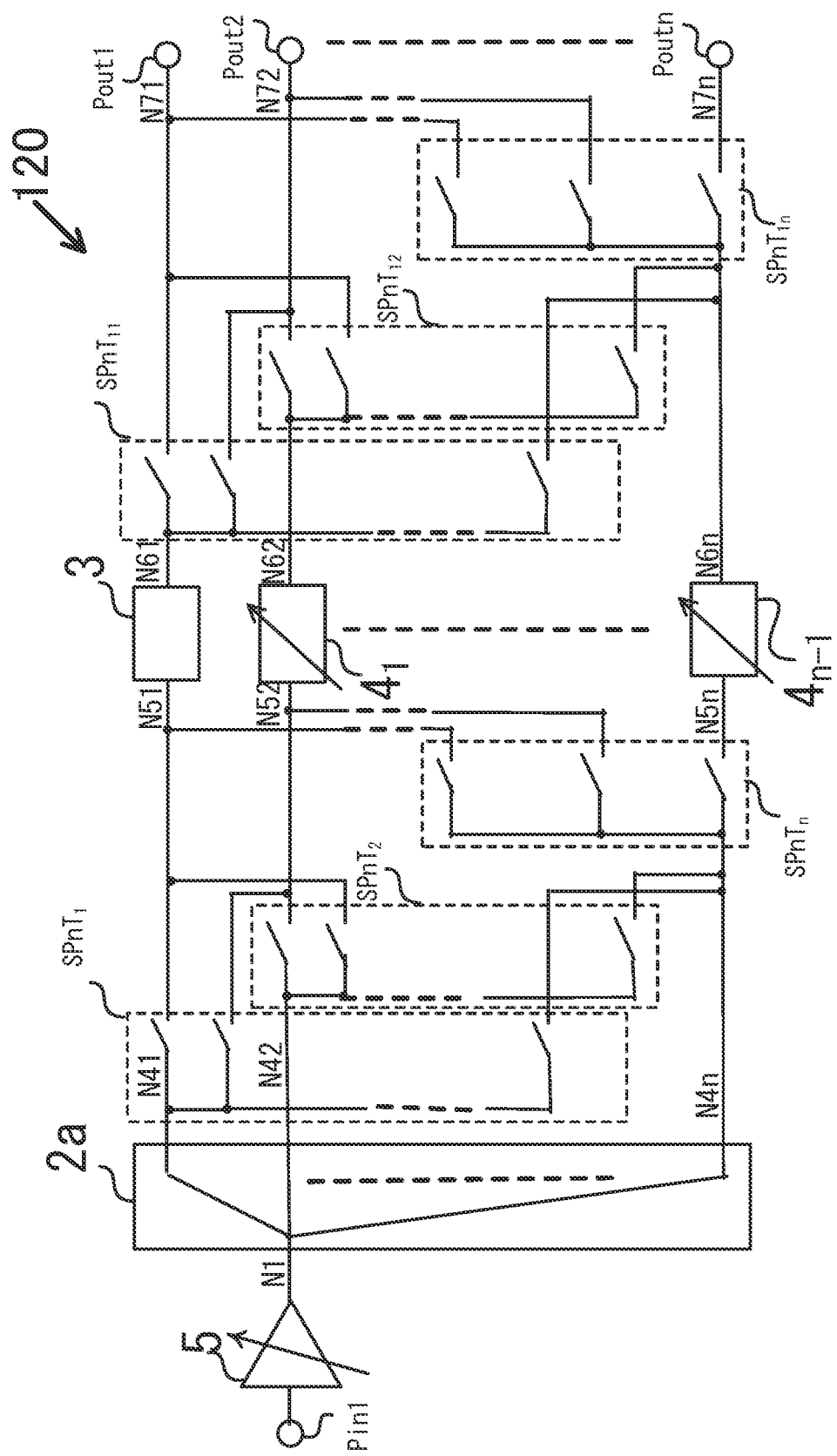
FIG. 14 is a circuit diagram illustrating a high frequency integrated circuit according to a fourth embodiment.

A high frequency integrated circuit according to a fourth embodiment will be described with reference to the drawing. FIG. 14 is a circuit diagram illustrating the high frequency integrated circuit.

In the fourth embodiment, a variable gain amplifier is used in the high frequency integrated circuit. A plurality of signals having different gain values are output from first to n-th high frequency output terminals, respectively.

In the following, the same portions as those in the third embodiment will be designated by the same reference numerals, explanations of those portions will be omitted, and only different portions will be described.

As illustrated in FIG. 14, a high frequency integrated circuit 120 includes a variable gain amplifier 5, the signal splitter 2a, the conductive element 3, the attenuators $4_1$ to $4_{n-1}$, the SPnT switches $SPnT_1$ to $SPnT_n$, the SPnT switches $SPnT_{11}$ to $SPnT_{1n}$, the high frequency input terminal Pin1, and the high frequency output terminals Pout1 to Poutn. The high frequency integrated circuit 120 is applied to a receiving block and the like in the wireless communication device according, to any of the 3G, 4G and 5G communication standards, for example. Here, n is an integer equal to or above 3.

The variable gain amplifier 5 is placed between the high frequency input terminal Pin1 and the node N1. The variable gain amplifier 5 receives and amplifies a signal input through the high frequency input terminal Pin1 and outputs the amplified signal from the node N1. Here, in the variable gain amplifier 5, a plurality of stages of gains are set. The signal splitter 2a receives the variable gain signal output from the variable gain amplifier 5 and splits the signal to n lines.

As described above, the high frequency integrated circuit of the embodiment has the variable gain amplifier 5, the signal splitter 2a, the conductive element 3, the attenuators $4_1$ to $4_{n-1}$, the SPnT switches $SPnT_1$ to $SPnT_n$, the SPnT switches $SPnT_{11}$ to $SPnT_{1n}$, the high frequency input terminal Pint, and the high frequency output terminals Pout1 to Poutn. The variable gain amplifier 5 outputs the variable gain signal.

As a consequence, it is possible to output more multiple gain values from the high frequency output terminals Pout1 to Poutn than the third embodiment.

Meanwhile, in the embodiment, the conductive element 3 may be replaced with an attenuator that is similar to the attenuators $4_1$ to $4_{n-1}$. In this case, although a circuit scale of the high frequency integrated circuit is increased, it is possible to increase multiple gain values from the high frequency output terminals Pout1 to Poutn, compared to the third embodiment.

While certain embodiments have been described, these embodiments have been presented by way of example only and are not intend to limit the scope of the inventions. Indeed, the novel embodiments described herein may be embodied in a variety of the other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A high frequency integrated circuit comprising:
   a signal splitter configured to receive a high frequency signal at an input terminal, to split the high frequency signal into two lines, and to output the signals split into the two lines from a first output terminal and a second output terminal, respectively;
   an attenuator in which multiple amounts of attenuation are set;
   a first conductive element in which a first amount of attenuation is set;
   a first switch placed between the first output terminal of the signal splitter and the first conductive element, and configured to select conductive or non-conductive between the first output terminal of the signal splitter and the first conductive element;
   a second switch placed between the first output terminal of the signal splitter and the attenuator, and configured to select conductive or non-conductive between the first output terminal of the signal splitter and the attenuator;
   a third switch placed between a second output terminal of the signal splitter and the first conductive element, and configured to select conductive or non-conductive between the second output terminal of the signal splitter and the first conductive element;
   a fourth switch placed between the second output terminal of the signal splitter and the attenuator, and configured to select conductive or non-conductive between the second output terminal of the signal splitter and the attenuator;
   a fifth switch placed between the first conductive element and a first high frequency output terminal, and configured to select conductive or non-conductive between the first conductive element and the first high frequency output terminal;
   a sixth switch placed between the first conductive element and a second high frequency output terminal, and configured to select conductive or non-conductive between the first conductive element and the second high frequency output terminal;
   a seventh switch placed between the attenuator and the first high frequency output terminal, and configured to select conductive or non-conductive between the attenuator and the first high frequency output terminal; and
   an eighth switch placed between the attenuator and the second high frequency output terminal, and configured to select conductive or non-conductive between the attenuator and the second high frequency output terminal, wherein
   the first to fourth switches are, respectively, arranged directly between the signal splitter and one of the attenuator and the conductive element,
   the fifth to eighth switches are, respectively, arranged directly between one of the attenuator and the conductive element and one of the first high frequency output terminal and the second high frequency output terminal, and
   the high frequency integrated circuit outputs a plurality of output signals having different gain values from the first high frequency output terminal and the second high frequency output terminal, respectively.

2. The high frequency integrated circuit according to claim 1, wherein the first conductive element has a small amount of loss to a passing signal and has an equivalent property to a minimum loss property of the attenuator.

3. The high frequency integrated circuit according to claim 1, wherein the signal splitter receives the signal output from one of a fixed gain amplifier and a variable gain amplifier as the high frequency signal.

4. The high frequency integrated circuit according to claim 1, wherein each amount of loss of the first switch to the eight switch to a passing signal is small, each isolation property of the first switch to the eight switch is high when the switch is off.

5. The high frequency integrated circuit according to claim 4, wherein
each of the first to eighth switches is composed of a T-type switch with three transistors, and
the three transistors forming the T-type switch have an identical shape.

6. The high frequency integrated circuit according to claim 5, wherein each of the transistors composing the first to eighth switches is any one of an N-channel metal-oxide silicon field-effect transistor formed on a silicon-on-insulator substrate, a pseudomorphic high electron mobility transistor, a gallium arsenide metal-semiconductor field-effect transistor, and an N-channel metal-oxide semiconductor field-effect transistor formed on a silicon substrate.

7. The high frequency integrated circuit according to claim 1, wherein
the attenuator includes:
a T-type attenuator composed of a switch and a resistor; and
a conductive element having an amount of loss equal to an amount of loss of the first conductive element.

8. The high frequency integrated circuit according to claim 1, wherein the high frequency integrated circuit is applied to wireless communication device.

9. The high frequency integrated circuit according to claim 8, wherein the high frequency integrated circuit is applied to any of a receiving block and a transmitting block in the wireless communication device in accordance with any of 3G, 4G, and 5G communication standards.

10. A high frequency integrated circuit comprising:
a signal splitter configured to receive a high frequency signal at an input terminal, to split the high frequency signal into n lines, n being an integer equal to or above 3, and to output the signals split into the n lines from first to n-th output terminals, respectively;
first to (n−1)-th attenuators in which multiple amounts of attenuation are set are set;
a first conductive element in which a first amount of attenuation is set;
a first single-pole-n-throw switch group placed between the signal splitter and a set of the first to (n−1)-th attenuators and the first conductive element, and including n single-pole-n-throw switches arranged and configured to select conductive or non-conductive between one of the first to n-th output terminals of the signal splitter and one of the set of the first to (n−1)-th attenuators and the first conductive element, and to turn off between the one of the first to n-th output terminals of the signal splitter and the rest of the set of the first to (n−1)-th attenuators and the first conductive element; and
a second single-pole-n-throw switch group placed between the set of the first to (n−1)-th attenuators and the first conductive element and a set of first to n-th high frequency output terminals, and including n single-pole-n-throw switches arranged and configured to select conductive or non-conductive between one of the set of the first to (n−1)-th attenuators and the first conductive element and one of the first to n-th high frequency output terminals and to turn off between the one of the set of the first to (n−1)-th attenuators and the first conductive element and the rest of the first to n-th high frequency output terminals, wherein the high frequency integrated circuit outputs a plurality of output signals having different gain values from the first to n-th high frequency output terminals, respectively.

11. The high frequency integrated circuit according to claim 10, wherein the first conductive element has a small amount of loss to a passing signal and has an equivalent property to a minimum loss property of the attenuators.

12. The high frequency integrated circuit according to claim 10, wherein the signal splitter receives the signal output from one of a fixed gain amplifier and a variable gain amplifier as the high frequency signal.

13. The high frequency integrated circuit according to claim 10, wherein each amount of loss of single-pole-n-throw switches forming the first single-pole-n-throw switch group and the second single-pole-n-throw switch group is small when the switch is on, and each isolation property of the single-pole-n-throw switches is high when the switch is off.

14. The high frequency integrated circuit according to claim 13, wherein
each of the single-pole-n-throw switches is composed of T-type switches, and
transistors forming the T-type switches have an identical shape.

15. The high frequency integrated circuit according to claim 10, wherein
each attenuator includes:
a T-type attenuator composed of a switch and a resistor, and
a conductive element having an amount of loss equal to an amount of loss of the first conductive element.

16. The high frequency integrated circuit according to claim 10, wherein the high frequency integrated circuit is applied to wireless communication device.

17. A high frequency integrated circuit comprising:
a signal splitter configured to receive a high frequency signal at an input terminal, to split the high frequency signal into two lines, and to output the signals split into the two lines from a first output terminal and a second output terminal, respectively;
a first attenuator in which multiple amounts of attenuation are set;
a second attenuator in which a plurality of amounts of attenuation having different values are set, and the amounts of attenuation are the same as the amounts of attenuation in the first attenuator;
a first switch placed between a first output terminal of the signal splitter and the first attenuator, and configured to select conductive or non-conductive between the first output terminal of the signal splitter and the first attenuator;
a second switch placed between the first output terminal of the signal splitter and the second attenuator, and configured to select conductive or non-conductive between the first output terminal of the signal splitter and the second attenuator;
a third switch placed between a second output terminal of the signal splitter and the first attenuator, and configured to select conductive or non-conductive between the second output terminal of the signal splitter and the first attenuator;
a fourth switch placed between the second output terminal of the signal splitter and the second attenuator, and configured to select conductive or non-conductive between the second output terminal of the signal splitter and the second attenuator;

a fifth switch placed between the first attenuator and a first high frequency output terminal, and configured to select conductive or non-conductive between the first attenuator and the first high frequency output terminal;

a sixth switch placed between the first attenuator and a second high frequency output terminal, and configured to select conductive or non-conductive between the first attenuator and the second high frequency output terminal;

a seventh switch placed between the second attenuator and the first high frequency output terminal, and configured to select conductive or non-conductive between the second attenuator and the first high frequency output terminal; and an eighth switch placed between the second attenuator and the second high frequency output terminal, and configured to select conductive or non-conductive between the second attenuator and the second high frequency output terminal, wherein the first to fourth switches are, respectively, arranged directly between the signal splitter and one of the first attenuator and the second attenuator, the fifth to eighth switches are, respectively, arranged directly between one of the first attenuator and the second attenuator and one of the first high frequency output terminal and the second high frequency output terminal, and the high frequency integrated circuit outputs a plurality of output signals having different gain values from the first high frequency output terminal and the second high frequency output terminal, respectively.

18. The high frequency integrated circuit according to claim 17, wherein the signal splitter receives the signal output from one of a fixed gain amplifier and a variable gain amplifier as the high frequency signal.

19. The high frequency integrated circuit according to claim 17, wherein each amount of loss of the first switch to the eight switch to a passing signal is small, each isolation property of the first switch to the eight switch is high when the switch is off.

* * * * *